United States Patent
Oka et al.

(10) Patent No.: US 9,646,907 B2
(45) Date of Patent: May 9, 2017

(54) MOLD PACKAGE AND MANUFACTURING METHOD THEREOF

(71) Applicant: DENSO CORPORATION, Kariya, Aichi-pref. (JP)

(72) Inventors: Kengo Oka, Kariya (JP); Yuki Sanada, Kariya (JP); Masayuki Takenaka, Kariya (JP); Shinya Uchibori, Kariya (JP); Tasuke Fukuda, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/893,987

(22) PCT Filed: May 29, 2014

(86) PCT No.: PCT/JP2014/002847
§ 371 (c)(1),
(2) Date: Nov. 25, 2015

(87) PCT Pub. No.: WO2014/196172
PCT Pub. Date: Dec. 11, 2014

(65) Prior Publication Data
US 2016/0133539 A1    May 12, 2016

(30) Foreign Application Priority Data
Jun. 3, 2013    (JP) .................................. 2013-116855

(51) Int. Cl.
*H01L 23/48*    (2006.01)
*H01L 23/52*    (2006.01)
(Continued)

(52) U.S. Cl.
CPC ........ *H01L 23/3121* (2013.01); *H01L 21/565* (2013.01); *H01L 23/3135* (2013.01);
(Continued)

(58) Field of Classification Search
CPC ............. H01L 23/3121; H01L 23/3135; H01L 23/49838; H01L 21/565
(Continued)

(56) References Cited

U.S. PATENT DOCUMENTS 5,927,505 A * 7/1999 Chia ................. B29C 45/14418
174/67
6,365,979 B1    4/2002 Miyajima
(Continued)

FOREIGN PATENT DOCUMENTS

JP    2000-133748 A    5/2000
JP    2006-310537 A    11/2006
JP    2006-313801 A    11/2006

OTHER PUBLICATIONS

International Search Report and Written Opinion of the International Searching Authority dated Sep. 9, 2014 issued in the corresponding International application No. PCT/JP2014/002847 (and English translation).

*Primary Examiner* — David S Blum
(74) *Attorney, Agent, or Firm* — Posz Law Group, PLC (57) ABSTRACT

A mold package includes a substrate having a first surface and a second surface disposed opposite to the first surface, a wiring part disposed on the first surface in protruded manner, a molding resin, and a resin film. The molding resin partially seals the first surface of the substrate and the wiring part and intersects with the wiring part. The resin film is disposed between the first surface of the substrate and the end of the molding resin, and seals the wiring part and the first surface of the substrate adjacent to the wiring part. The resin film includes a first portion disposed inside the molding resin and a second portion disposed outside the molding resin. An upper surface of the second portion is lower than an upper surface of the first portion and has less uneven portions than the upper surface of the first portion.

4 Claims, 6 Drawing Sheets

(51) Int. Cl.
*H01L 29/40* (2006.01)
*H01L 21/44* (2006.01)
*H01L 23/31* (2006.01)
*H01L 21/56* (2006.01)
*H01L 23/498* (2006.01)

(52) U.S. Cl.
CPC ............... *H01L 23/49838* (2013.01); *H01L 2224/48091* (2013.01); *H01L 2224/49175* (2013.01); *H01L 2924/181* (2013.01); *H01L 2924/19105* (2013.01)

(58) Field of Classification Search
USPC .......................................... 257/773; 438/612
See application file for complete search history.

(56) References Cited

U.S. PATENT DOCUMENTS

| 2003/0145461 A1 | 8/2003 | Kasai et al. |
| 2005/0263871 A1 | 12/2005 | Shinma et al. |
| 2007/0158830 A1 | 7/2007 | Miyamoto et al. |
| 2013/0256851 A1 | 10/2013 | Noda |

* cited by examiner

MOLD PACKAGE AND MANUFACTURING METHOD THEREOF

CROSS REFERENCE TO RELATED APPLICATION

This application is a U.S. national stage of International Application No. PCT/JP2014/002847 filed on May 29, 2014 and is based on Japanese Patent Application No. 2013-116855 filed on Jun. 3, 2013, the disclosures of which are incorporated herein by reference.

TECHNICAL FIELD

The present disclosure relates to a mold package, which seals one surface of a substrate and a wiring part disposed on the one surface of the substrate with a molding resin, and also relates to a manufacturing method of the mold package. In this mold package, the wiring part is disposed to straddle a periphery end of the molding resin.

BACKGROUND ART

A mold package including a substrate having one surface and another surface opposite to the one surface is well known. In this kind of mold package, a wiring part is disposed on the one surface of the substrate, and the one surface and the wiring part are sealed by the molding resin (for example, refer to Patent Literature 1).

In this kind of mold package, the wiring part is sealed by the molding resin so that the wiring part is disposed to straddle a periphery end of the molding resin. That is, an end of the molding resin intersects with the wiring part and partial portion of the wiring part is exposed from the molding resin and the remaining portion of the wiring part is sealed by the molding resin.

In the above-described configuration, when appressing a metal mold for shaping the molding resin on the substrate, a gap is generated between the metal mold and the substrate caused by an uneven surface of the wiring part. Thus, in the molding process, the resin may leak toward outside from the gap between the metal mold and the substrate. The leakage of the molding resin may cause a resin burr at a portion which forbids an existence of the molding resin.

PRIOR ART LITERATURES

Patent Literature

[Patent Literature 1] JP 2003-229443 A

SUMMARY OF INVENTION

In view of the foregoing difficulties, it is an object of the present disclosure to provide a mold package that restricts a generation of a resin burr caused by a leakage of resin material from a periphery end of a molding resin, and to provide a manufacturing method of the mold package. Herein, the mold package seals one surface of a substrate and a wiring part disposed on the one surface of the substrate with the molding resin, and the wiring part is disposed to straddle the periphery end of the molding resin.

According to an aspect of the present disclosure, a mold package includes a substrate, a wiring part, a molding resin, and a resin film. The substrate has a first surface and a second surface disposed opposite to the first surface. The wiring part is disposed on the first surface of the substrate and protruded from the first surface of the substrate. The molding resin is disposed on the first surface of the substrate. The molding resin partially seals the first surface of the substrate and partially seals the wiring part, the molding resin includes an end disposed on the wiring part and intersects with the wiring part, and the end of the molding resin is disposed at a periphery portion of the molding resin so that a portion of the wiring part is exposed from the molding resin and a remaining portion of the wiring part is sealed by the molding resin. The resin film is disposed between the first surface of the substrate and the end of the molding resin. The resin film seals the wiring part and a portion of the first surface of the substrate which is adjacent to the wiring part, the resin film extends from an inner side of the end of the molding resin to an outer side of the end of the molding resin, the resin film includes a first portion disposed at the inner side of the molding resin and a second portion disposed at the outer side of the molding resin, the second portion is seamlessly integrated with the first portion, the first portion of the resin film has an upper surface and the second portion of the resin film has an upper surface, the upper surface of the second portion is lower than the upper surface of the first portion by providing a rising portion between the second portion and the first portion, and the upper surface of the second portion has less uneven portions that are caused by the wiring part compared with the upper surface of the first portion.

In the above mold package, the upper surface of the second portion of the resin film has small numbers of uneven portions. Thus, a high surface adhesion between the upper surface of the second portion and the metal mold can be secured and a resin burr caused by the leakage of the molding resin from the end of the molding resin can be properly restricted.

According to another aspect of the present disclosure, a manufacturing method of a mold package is provided. The mold package includes a substrate, a wiring part, a molding resin, and a resin film. The substrate has a first surface and a second surface disposed opposite to the first surface. The wiring part is disposed on the first surface of the substrate and protruded from the first surface of the substrate. The molding resin is disposed on the first surface of the substrate. The molding resin partially seals the first surface of the substrate and partially seals the wiring part, the molding resin includes an end disposed on the wiring part and intersects with the wiring part, and the end of the molding resin is disposed at a periphery portion of the molding resin so that a portion of the wiring part is exposed from the molding resin and a remaining portion of the wiring part is sealed by the molding resin. The resin film is disposed between the first surface of the substrate and the end of the molding resin. The resin film seals the wiring part and a portion of the first surface of the substrate which is adjacent to the wiring part, and extends from an inner side of the end of the molding resin to an outer side of the end of the molding resin.

The manufacturing method of the mold package includes a preparation process preparing the substrate on which the wiring part is disposed, a resin film formation process forming the resin film on a predetermined portion of the first surface of the substrate, herein the predetermined portion is a portion that faces the resin film to be formed, and a molding process placing the substrate to which the resin film is attached in a metal mold and forming the molding resin on the first surface of the substrate. The metal mold has a cavity and the cavity has a shape corresponding to a shape of the molding resin, and the end of the molding resin is disposed on the wiring part via the resin film and intersects with the wiring part.

The resin film includes a first portion disposed at the inner side of the molding resin and a second portion disposed at the outer side of the molding resin. The second portion is seamlessly integrated with the first portion. The metal mold is partially contacted with and pressed on the resin film in the molding process to shape the second portion of the resin film, and the second portion of the resin film has an upper surface disposed lower than an upper surface of the first portion by a rising portion. The molding resin is filled in the metal mold after the upper surface of the second portion is pressed by the metal mold to have less uneven portions compared with the upper surface of the first portion.

With the above manufacturing method, in the molding process, the first portion of the resin film is placed in the cavity without being contacted with the metal mold. Under this state, the second portion is appressed by the metal mold. By this appressing, the second portion of the resin film is contacted with the metal mold with the planarized uneven portions. The uneven portions are caused by the wiring part disposed under resin film. Thus, the leakage of the molding resin can be restricted.

In the present disclosure, the rising portion disposed between the first portion and the second portion in the resin film is also contacted with the metal mold. Thus, a leakage path of the molding resin is generated along the rising portion. That is, the leakage path has a bent shape, and the bent shape of the leakage path can greatly restrict the leakage of the molding resin compared with a case in which the leakage path has a straight shape.

As described above, in the present disclosure, during the molding process, the leakage of the molding resin from the gap between the metal mold and the substrate can be restricted. Herein, the gap is generated by the uneven portions on the substrate caused by the wiring part. Thus, a resin burr caused by the leakage of the molding resin from the end of the molding resin can be properly restricted.

BRIEF DESCRIPTION OF DRAWINGS

The above and other objects, features and advantages of the present invention will become more apparent from the following detailed description made with reference to the accompanying drawings. In the drawings.

EMBODIMENTS FOR CARRYING OUT INVENTION

Figure 7A:
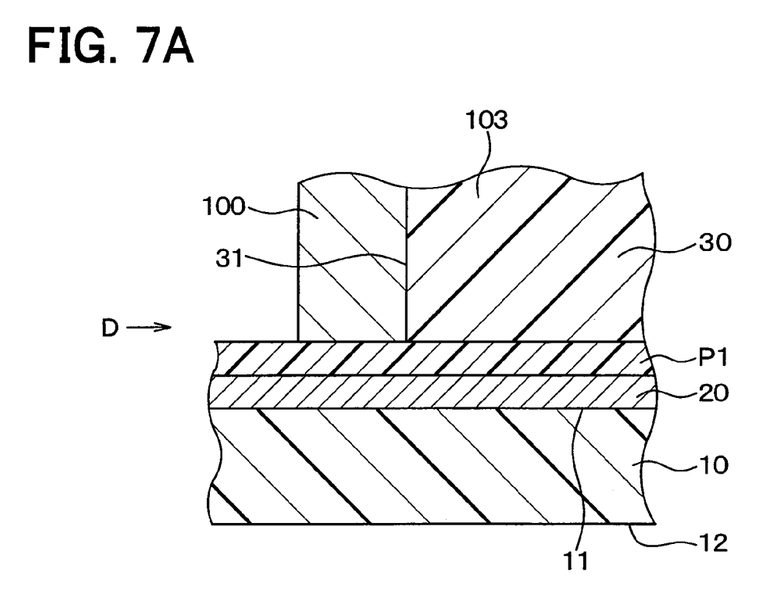
FIG. 7A is a diagram showing a cross-sectional view of a mold package which is manufactured as a test sample by inventors of the present disclosure.
Figure 7B:
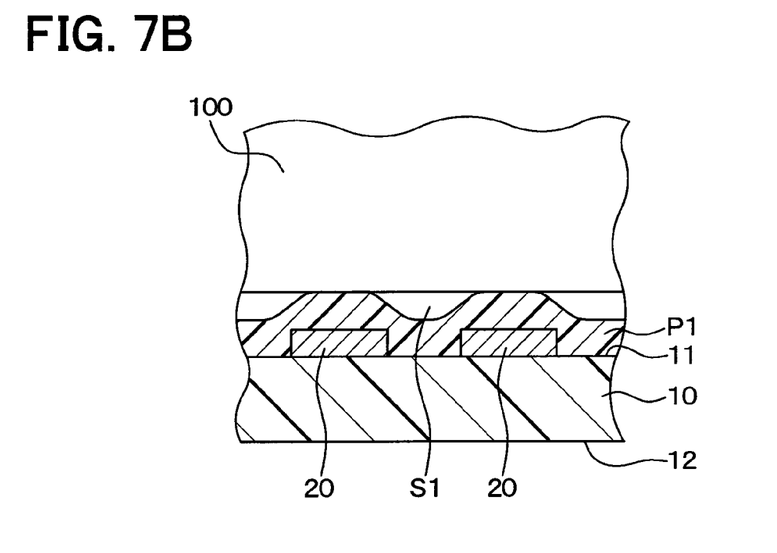
FIG. 7B is a diagram showing a side view of the mold package shown in FIG. 7A in a direction shown by an arrow D.

The inventors of the present disclosure have carried out a trial manufacturing of a mold package as shown in FIG. 7A and FIG. 7B. During the trial manufacturing, the inventors faced the following difficulties.

As shown in FIG. 7A and FIG. 7B, a substrate 10 has one surface 11 and another surface 12 arranged opposite to the one surface 11, and a wiring part 20 including multiple wires are arranged on the one surface 11 of the substrate 10 at intervals. The multiple wires 20 are protruded from the one surface 11 of the substrate 10. The one surface 11 of the substrate 10 and the multiple wires 20 are sealed by a molding resin 30. The one surface 11 of the substrate 10 is also referred to as a first surface, and another surface 12 of the substrate 10 is also referred to as a second surface.

The molding resin 30 has a periphery end 31, and the periphery end 31 is disposed along an arranging direction of the multiple wires of the wiring part 20 and intersects with the multiple wires. Specifically, for each wire 20, an end is disposed inside of the molding resin 30 and the other end is disposed outside the periphery end 31 of the molding resin 30.

Usually, each wire 20 is sealed by a protection film P1 made of electrically insulating material, such as polyimide. The protection film P1 seals the wiring part 20 and an intervening portion between adjacent wires of the wiring part 20 on the one surface 11 of the substrate 10. The molding resin 30 is disposed on the protection film P1.

As described above, the molding resin 30 for sealing the one surface 11 and the wiring part 20 is formed using a metal mold 100 by molding process. The metal mold 100 has a cavity 103 for shaping the molding resin 30, and the cavity 103 has a shape corresponding to a shape of the molding resin 30. In the molding process, the metal mold 100 is appressed to the one surface 11 of the substrate 11 at a portion exposed from the molding resin 30.

In the trial manufacturing, as shown in FIG. 7B, the portion to which the metal mold 100 is appressed has uneven portions caused by the wiring part 20. Thus, gaps S1 are generated between the metal mold 100 and the substrate 10. In the molding process, the molding resin 30 may leak from the gap S1. The leakage of the molding resin 30 may cause a generation of a resin burr at a portion which forbids an existence of the molding resin 30.

The following will describe embodiments of the present disclosure with reference to the accompanying drawings. Embodiments of the present disclosure will be described below with reference to the drawings. In the following respective embodiments, parts identical with or equivalent to each other are denoted by the same symbols for simplifying description.

First Embodiment

Figure 1A:
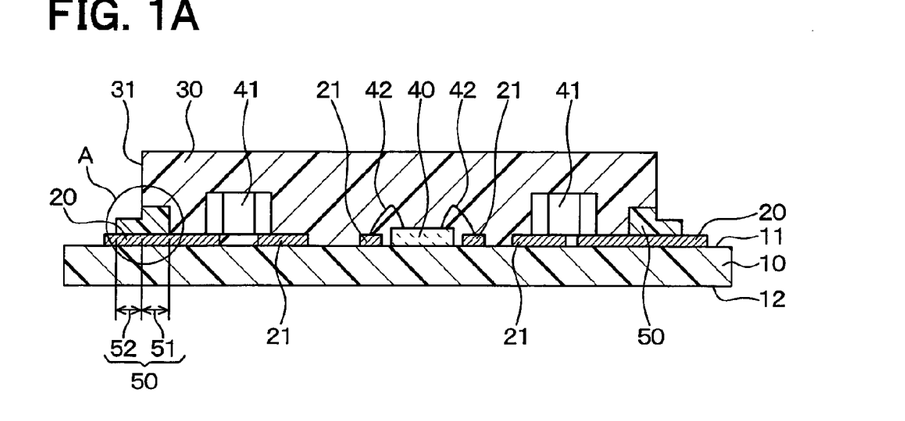
FIG. 1A is a diagram showing a cross-sectional view of a mold package according to a first embodiment of the present disclosure.
Figure 1B:
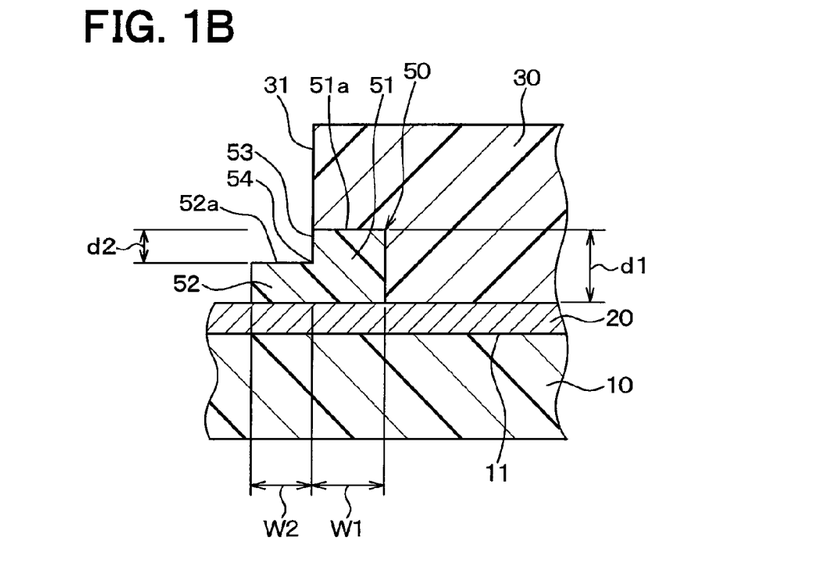
FIG. 1B is a diagram showing an enlarged view of an area A shown in FIG. 1A.
Figure 2:
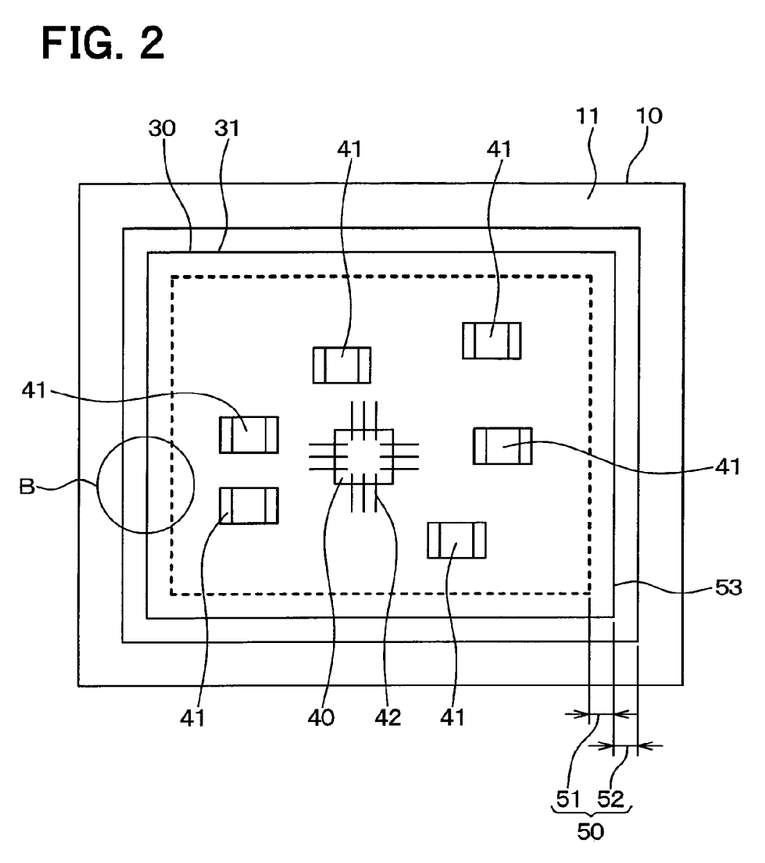
FIG. 2 is a diagram showing a top view of the mold package shown in FIG. 1A.
Figure 3A:
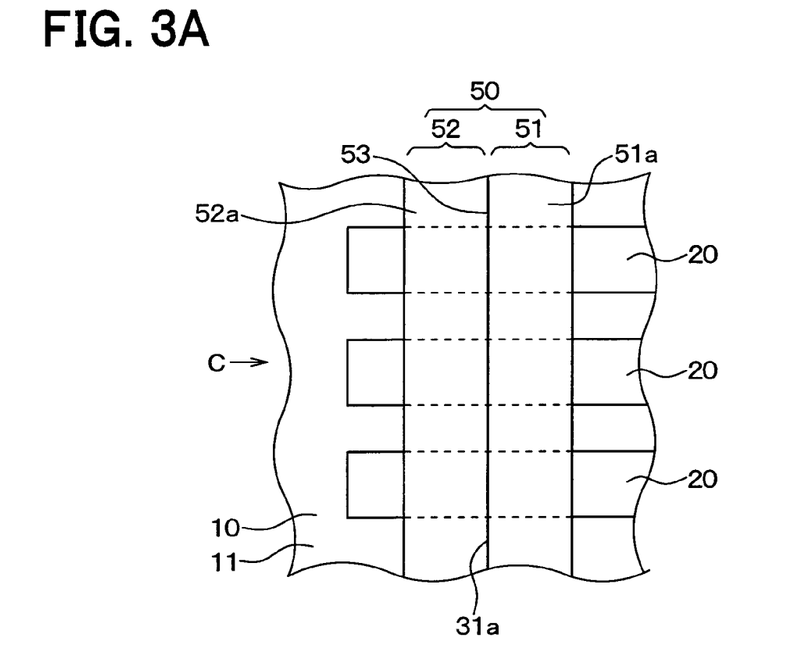
FIG. 3A is a diagram showing an enlarged view of an area B shown in FIG. 2.
Figure 3B:
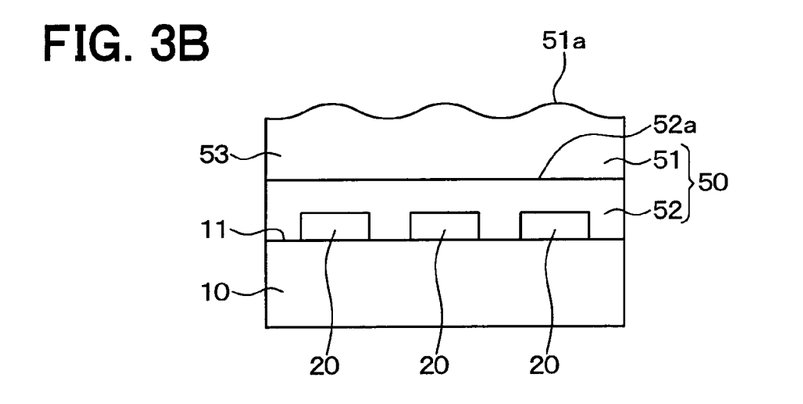
FIG. 3B is a diagram showing a side view of the mold package shown in FIG. 3A in a direction shown by an arrow C.

The following will describe a mold package according to a first embodiment of the present disclosure with reference to FIG. 1A to FIG. 3B. In FIG. 2, the wiring part is omitted. In FIG. 3A, an end 31 of the molding resin 30 is shown by a dashed line. In FIG. 3B, the molding resin 30 is omitted. The mold package may be mounted to a vehicle, and may be used as an apparatus for driving various apparatuses equipped to the vehicle.

The mold package according to the present embodiment mainly includes a substrate 10, wiring parts 20, 21, and a molding resin 30. The substrate 10 has one surface 11 and another surface 12 arranged opposite to the one surface 10. The wiring parts 20, 21 are disposed on the one surface 11 of the substrate 10 and are protruded from the one surface 11. The molding resin 30 seals the one surface 11 of the substrate 10 and the wiring parts 20, 21. In the present embodiment, electronic components 40, 41 are disposed on the one surface 11 of the substrate 10, and the electric components 40, 41 are also sealed by the molding resin 30.

The molding resin 30 is disposed on the one surface 11 of the substrate 10. The molding resin 30 seals the wiring part 20, the electric components 40, 41, and the one surface 11 of the substrate 10. In the present embodiment, another surface 12 of the substrate 10 is exposed from the molding resin 30. As described above, a typical half-molded package will be described as an example of the mold package according to the present embodiment.

The substrate 10 in the present embodiment is provided by a printed board mainly made of resin material, such as epoxy resin or a glass epoxy resin. As shown in FIG. 2, the substrate 10 has a planar rectangular shape.

The wiring parts 20, 21 include a first wiring part 20 and a second wiring part 21. The first wiring part 20 is disposed to straddle the periphery end 31 of the molding resin 30 on the one surface 11 of the substrate 10. The second wiring part 21 is entirely disposed inside of the molding resin 30.

The first wiring part 20 extends from inner side of the molding resin 30 to outer side of the molding resin 30. Herein, on the one surface 11 of the substrate 10, the first wiring part 20 extends in a direction from a central portion sealed by the molding resin 30 to a periphery portion exposed from the molding resin 30.

The wiring parts 20, 21 are made of metal material, such as Cu. As shown in FIG. 3A and FIG. 3B, the first wiring part 20 includes multiple first wires arranged in a direction at intervals. The end 31 of the molding resin 30 is disposed along an arrangement direction of the multiple first wires 20, and intersects with the multiple first wires 20.

The end 31 of the molding resin 30 is approximately disposed on a middle portion of each first wire 20 and intersects with each first wire 20 at the middle portion. In each first wire 20, a portion disposed close to an end of the substrate 10 is exposed from the molding resin 30, and remaining portion disposed close to a central portion of the substrate 10 is sealed by the molding resin 30.

The electric components 40, 41 mounted on the one surface 11 of the substrate 10 may include surface mounting devices or through hole devices. In the present embodiment, the electronic components include an IC chip 40 and a passive component 41 as an example.

The IC chip 40 is electrically connected to the wires 20, 21 using mounting material, which is not shown, and a bonding wire 42. The mounting material may be provided by solder or Ag paste. The bonding wire 42 may be made of Au or Al. The passive component 41 may be a capacitor or a resistor, and is connected to the wires 20, 21 by the mounting material.

The molding resin 30 is made of typical molding material, such as epoxy resin. The molding resin 30 may further include filler, such as alumina or silica. The molding resin 30 may be formed by a transfer molding method or a compression molding method.

The molding resin 30 has a plate shape and has a planar size equal to smaller than a planar size of the substrate 10. As shown in FIG. 2; the molding resin 30 has a planar rectangular shape, and has four ends 31 at four periphery sides of the rectangular shape.

As shown in FIG. 1A to FIG. 3B, a resin film 50 is disposed between the one surface 11 of the substrate 10 and the end 31 of the molding resin 30. The resin film 50 is seamlessly shaped as one piece. At each side of the molding resin 30, a width direction of the resin film 50 is disposed extending from an outer side of the end 31 of the molding resin 30 toward an inner side of the molding resin 30.

The resin film 50 partially seals each of the multiple first wires 20 and also seals a portion of the one surface 11 of the substrate 10 disposed adjacent to the first wire 20 or disposed between two adjacent first wires 20.

As shown in FIG. 2, the resin film 50 is disposed along each end 31 of the molding resin 30 and has a rectangular frame shape on a plane. The resin film 50 includes a first portion 51 disposed inside of the molding resin 30 and a second portion 52 disposed outside of the molding resin 30.

As shown in FIG. 1A, FIG. 1B, FIG. 3A, and FIG. 3B, the resin film 50 has a rising portion 53 disposed at a border between the first portion 51 and the second portion 52. The rising portion 53 is disposed corresponding to the end 31 of the molding resin 30. The end 31 of the molding resin 30 and the rising portion 53 are disposed on the same plane that is perpendicular to the one surface 11 of the substrate 10. The second portion 52 has an upper surface 52a and the first portion 51 has an upper surface 51a. On the substrate 10, the upper surface 51a of the first portion 51 is disposed lower than the upper surface 52a of the second portion 52 via the rising portion 53.

As described above, the protruded first wires 20 cause uneven portions on the upper surface of the resin film 50. In the present embodiment, the upper surface 52a of the second portion 52 has less uneven surface than the upper surface 51a of the first portion 51. Specifically, as shown in FIG. 3A and FIG. 3B, the upper surface 51a of the first portion 51 has uneven surface which is inherited from the uneven surface of the multiple first wires 20. On the upper surface 52a of the second portion 52, the uneven portions are reduced and the upper surface 52a of the second portion has an approximately planar shape.

As described above, the resin film 50 is seamlessly shaped as one piece. That is, the first portion 51 and the second portion 52 are seamlessly integrated with each other as one piece and are made of the same material. Specifically, the resin film 50 is shaped by applying resin material, such as polyimide, acrylic resin, or epoxy resin on the one surface 11 of the substrate 10 and hardening the resin material. A coefficient of elasticity of the resin film 50 is appropriately set to 10 GPA for absorbing thermal stress.

The following will describe an example of dimensions of the resin film 50 shown in FIG. 1B. The dimensions are not limited to the this example. The first portion 51 may have a width W1 of equal to or greater than 0.2 millimeters, and the second portion 52 may have a width W2 of equal to or greater than 0.2 millimeters. The first portion 51 may have a thickness d1 (film thickness) of equal to or greater than several dozen micrometers, the rising portion 53 may have a height d2 of equal to or greater than 1 micrometer. Favorably, the rising portion 53 may have a height d2 of equal to or greater than 5 micrometers.

Figure 4A:
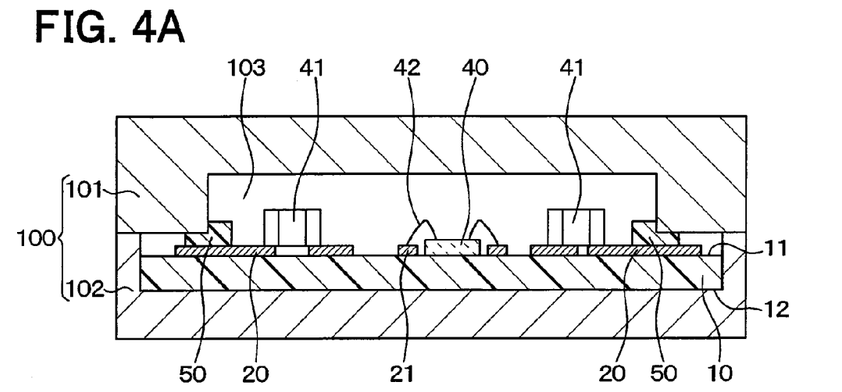
FIG. 4A is a diagram showing a cross-sectional view of the mold package during a manufacturing process according to the first embodiment.
Figure 4B:
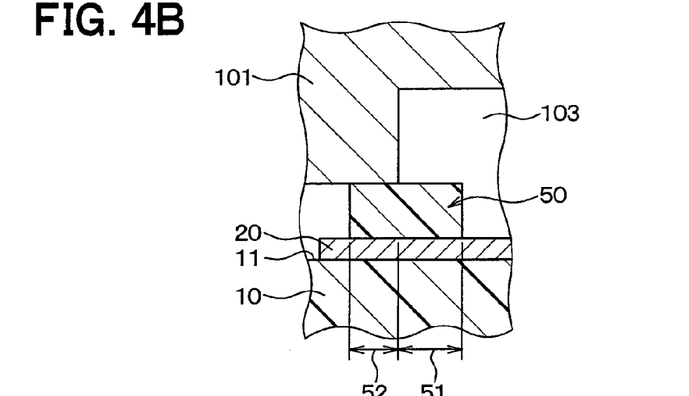
FIG. 4B is a diagram showing an enlarged view of a vicinity of a resin film before a pressing process.
Figure 4C:
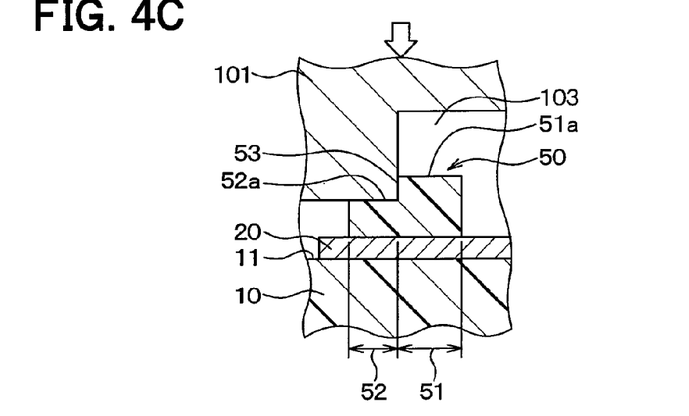
FIG. 4C is a diagram showing an enlarged view of the vicinity of the resin film after the pressing process is performed.

The following will describe a manufacturing method of the mold package according to the present embodiment with reference to FIG. 4A to FIG. 4C. First, in the preparation process, the substrate 10 including the wires 20, 21 are prepared. For example, the preparation process may be performed by a manufacturing method of a typical printed board.

In the following resin film formation process, on the one surface 11 of the substrate 10, the resin film 50 is formed at a predetermined position at which the end 31 of the molding resin 30 is to be disposed. In the resin film formation process, material of the resin film 50 may be applied on the one surface 11 of the substrate 10 by, for example, a printing or dispensing. Then, the applied material is hardened for forming the resin film 50.

The resin film 50 partially seals each of the multiple first wires 20 and a portion of the one surface 11 of the substrate 10 disposed adjacent to the first wire or disposed between adjacent first wires 20. In this step, as shown in FIG. 4B, the resin film 50 has no height difference on the top surface since the rising portion 53 is yet not formed between the first portion 51 and the second portion 52.

Then, in the component mounting process, the electric components 40, 41 are mounted on the one surface of the substrate 10, and the wire bonding is performed to connect the electric components 40, 41 with the wires. By this process, the electric components 40, 41 are mounted to the substrate 10. The resin film formation process and the component mounting process may be switched as needed in the practical processing.

Then, the molding process is carried out as shown in FIG. 4A to FIG. 4C. In the molding process, a metal mold 100 having a cavity 103 is used to shape the molding resin 30. The cavity 103 of the metal mold has a shape corresponding to a shape of the molding resin 30. The metal mold 100 includes an upper mold 101 and a lower mold 102 to be joined with the upper mold 101 for performing the resin molding. The upper mold 101 is removable from the lower mold 102. The cavity 103 is defined between the upper mold 101 and the lower mold 102.

As shown in FIG. 4A, in the molding process, the substrate 10 to which the electric components 40, 41 are mounted and the resin film 50 is attached is placed at an inside portion of the metal mold 100. At this time, as shown in FIG. 4B, the second portion 52 of the resin film 50 is contacted with the upper mold 101 of the metal mold 100. Further, as shown in FIG. 4C, the upper mold 101 presses the second portion 52 in a direction toward the substrate 10.

By pressing the second portion 52, the rising portion 53 of the resin film 50 is formed at a border between the first portion 51 and the second portion 52. Further, the rising portion 53 is formed under the end 31 of the molding resin 30 so that the end 31 of the molding resin 30 and the rising portion 53 are disposed on the same plane that is perpendicular to the one surface 11 of the substrate 10.

As shown in FIG. 4C, the upper surface 52a of the second portion 52 becomes lower than the upper surface 51a of the first portion 51 by forming the rising portion 53. That is, when the upper surface 52a of the second portion 52 is defined as a low portion, the upper surface 51a of the first portion 51 is defined as a high portion that is higher than the low portion.

As described above, the second portion 52 of the resin film 50 is pressed by the metal mold. Thus, on the upper surface 52a of the second portion 52, the uneven portions caused by the first wires 20 are planarized compared with the upper surface 51a of the first portion 51. The resin material for configuring the molding resin 30 is filled in the cavity 103 under a condition that the second portion 52 of the resin film 50 is pressed by the metal mold 100.

By the above-described process, the molding resin 30 is formed on the one surface 11 of the substrate 10. The end 31 of the molding resin 30 is formed so that the end 31 is disposed in an arrangement direction of the multiple first wires 20 on the multiple first wires 20 and intersects with the multiple first wires 20. Then, the substrate 10 to which the molding resin 30 is attached is taken out from the metal mold 100, and the molding process is ended. The mold package according to the present embodiment is manufactured as described above.

In the present embodiment, during the molding process, the first portion 51 of the resin film 50 is disposed within the cavity 103 without being contacted with and pressed by the upper mold 101 of the metal mold 100. During the molding process, only the second portion 52 is pressed by the upper mold 101 of the metal mold 100 under the state in which the first portion 51 of the resin film 50 is disposed within the cavity 103 without being contacted with and pressed by the upper mold 101 of the metal mold 100.

By pressing the second portion 52 of the resin film 50, uneven portions of the upper surface 52a of the second portion 52 are substantially planarized by the upper mold 101 of the metal mold 100. By this configuration, a leakage of the molding resin 30 is restricted.

In the present embodiment, as shown in FIG. 4A to FIG. 4C, during the molding process, the rising portion 53 of the resin film 50, which is disposed between the first portion 51 and the second portion 52, is also contacted with the upper mold 101. Thus, a leakage path of the resin material to form the molding resin 30 is generated along the rising portion 53. That is, the leakage path has a bent shape along the rising portion 53 and the second portion 52. The bent shape of the leakage path can substantially restrict the resin material leakage compared with a case in which the leakage path has a straight shape.

As described above, in the present embodiment, during the molding process, the resin material for configuring the molding resin 30 is avoided from leaking from the gap generated between the metal mold 100 and the substrate 100. The gap is generated by the uneven portions of the upper surface 51a of the first portion 51. Herein, the uneven portions of the upper surface 51a of the first portion 51 are caused by the first wires 20. Thus, resin burr that is protruded from the end 31 of the molding resin 30 can be effectively avoided by restricting the resin material leakage.

In the molding process, when pressing the resin film 50 using the metal mold 100, the resin film 50 is deformed and the deformation of the resin film 50 may relax the pressure applied to the first wires 20 and the substrate 10 disposed immediately under the resin film 50. Thus, damage to the substrate 10 and the first wires 20 can be reduced by the resin film 50.

Conventionally, as shown in FIG. 7A, a force concentration point caused by a difference between the linear expansion coefficients of the molding resin and the substrate is positioned at an interface between the end 31 of the molding resin 30 and the substrate 10. According to the mold package in the present embodiment, the force concentration point caused by the linear expansion coefficient difference is positioned at a corner 54 at which the rising portion 53 connects with the upper surface 52a of the second portion 52 in the integrally-shaped resin film 50 as shown in FIG. 1B.

According to the present embodiment, the above-described force is avoided from being concentrated at the end 31 of the molding resin 30. Thus, the molding resin 30 is avoided from being detached or separated from the substrate 10. In the present embodiment, the resin film 50 has a lower elastic modulus and is softer than the molding resin 30. Further, the height d2 of the rising portion 53 is appropriately set to be equal to or higher than 1 micrometer, or more preferably, set to be equal to or higher than 5 micrometers.

The resin film 50 has a relatively lower elastic modulus. Thus, the deformation quantity of the resin film 50 increases with an increase of the softness of the resin film 50 or with an increase of the thickness of the resin film 50. When the deformation quantity of the resin film 50 increases, the second portion 52 of the resin film 50 has a more planarized upper surface 52a. With consideration of the deformation of the resin film 50, the elastic modulus and the thickness of the resin film 50 may be properly decided.

Second Embodiment

Figure 5:
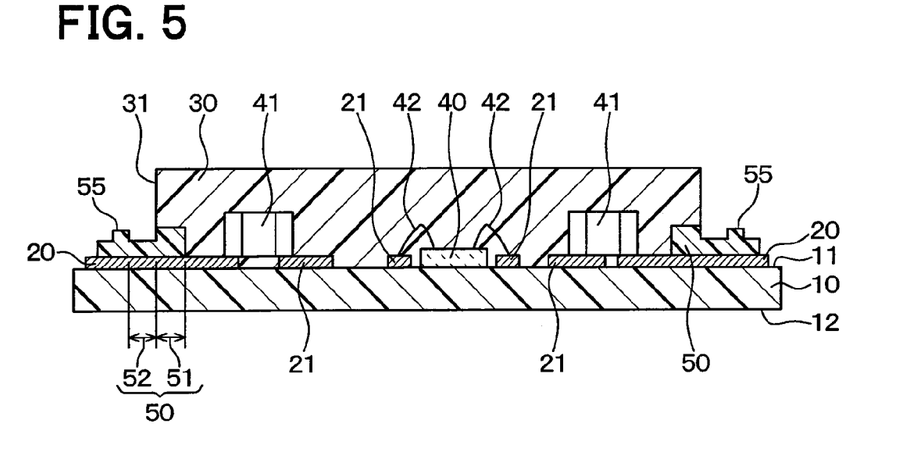
FIG. 5 is a diagram showing a cross-sectional view of a mold package according to a second embodiment of the present disclosure.

The following will describe a mold package according to a second embodiment of the present disclosure with reference to FIG. 5. The following will mainly describe different part of the second embodiment compared with the first embodiment.

As shown in FIG. 5, in the present embodiment, the resin film 50 includes a protruded portion 55. The protruded portion 55 is disposed at an outside portion of the molding resin 30, and is disposed farther than the second portion 52 from the end 31 of the molding resin 30. The protruded portion 55 is protruded from the resin film 50 and has a surface higher than the upper surface 52a of the second portion 52. The resin film 50 having the above-described protruded portion 55 may be formed using an upper mold 101, which has a recessed portion corresponding to the protruded portion 55, in the molding process.

In the present embodiment, the protruded portion 55 functions as a stopper for stopping the leakage of the resin material of the molding resin 30 in the molding process. Specifically, in a case where the resin material of the molding resin 30 is leaked from the cavity 103 of the metal mold 100 to the upper surface 52a of the second portion 52 of the resin film 50, a spread of the molding resin 30 can be restricted by the protruded portion 55.

Third Embodiment

Figure 6:
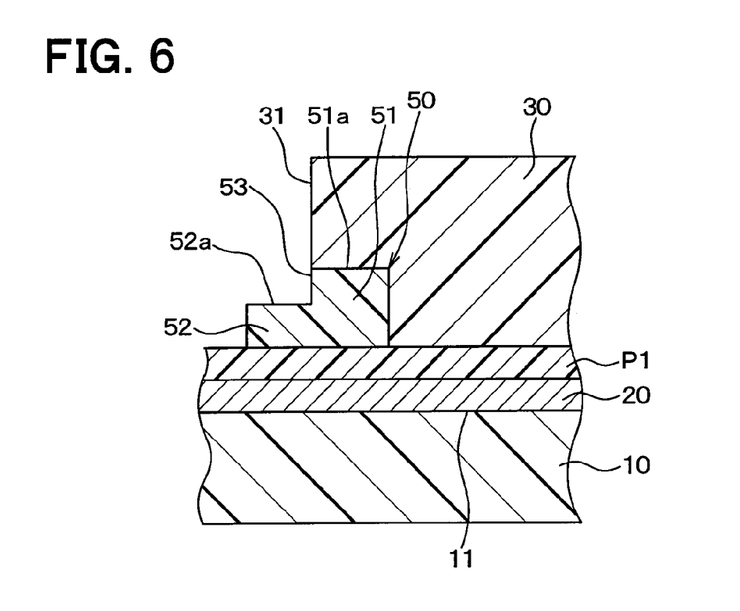
FIG. 6 is a diagram showing a cross-sectional view of a mold package according to a third embodiment of the present disclosure.

The following will describe a mold package according to a third embodiment of the present disclosure with reference to FIG. 6. As shown in FIG. 6, a protection film P1, which is used in the conventional art, may be disposed on the first wires 20. In this case, the protection film P1 is disposed between the resin film 50 and the first wires 20 (refer to FIG. 7A and FIG. 7B). Further, the protection film P1 may also be disposed on the first wires 20 in each of the foregoing embodiments.

Other Embodiments

The substrate 10 may be provided by a ceramic substrate made of ceramic materials, such as alumina or silica.

A mold package having a structure different from the above-described structure may also be used under a condition that the molding resin partially seals the one surface 11 of the substrate 10 and the wires 20 disposed on the one surface and the wires 20 are arranged to straddle the end 31 of the molding resin 30. For example, the molding resin 30 may also be disposed at another surface 12 to seal another surface 12 of the substrate 10 in addition to the one surface 11 of the substrate 10. Further, a mold package in which the electric components 40, 41 are omitted may also be provided as the mold package according to the present disclosure.

In the foregoing embodiments, the first wiring part 20 includes multiple first wires arranged in a direction at intervals. As another example, the first wiring part 20 may include at least one first wire a portion of which is exposed from the molding resin 30 and the remaining portion is sealed by the molding resin 30. In this kind of first wiring part 20, the end 31 of the molding resin 30 is also arranged along a direction that intersects with the wire of the first wiring part 20 at the middle portion of the first wiring part 20. For example, the first wiring part 20 may include only one first wire 20. In this case, the uneven portions are also formed on the surface of the resin film 50 caused by the one first wire 20 and a portion of the one surface 11 of the substrate 10 placed adjacent to the one first wire 20.

While the disclosure has been described with reference to preferred embodiments thereof, it is to be understood that the disclosure is not limited to the preferred embodiments and constructions. The disclosure is intended to cover various modification and equivalent arrangements. In addition, while the various combinations and configurations, which are preferred, other combinations and configurations, including more, less or only a single element, are also within the spirit and scope of the disclosure.

The invention claimed is:

1. A mold package comprising:
a substrate having a first surface and a second surface disposed opposite to the first surface;
a wiring part disposed on the first surface of the substrate and protruded from the first surface of the substrate;
a molding resin disposed on the first surface of the substrate, wherein the molding resin partially seals the first surface of the substrate and partially seals the wiring part, the molding resin includes an end disposed on the wiring part and intersects with the wiring part, and the end of the molding resin is disposed at a periphery portion of the molding resin so that a portion of the wiring part is exposed from the molding resin and a remaining portion of the wiring part is sealed by the molding resin; and
a resin film disposed between the first surface of the substrate and the end of the molding resin, wherein the resin film seals the wiring part and a portion of the first surface of the substrate which is adjacent to the wiring part, the resin film extends from an inner side of the end of the molding resin to an outer side of the end of the molding resin, the resin film includes a first portion disposed at the inner side of the molding resin and a second portion disposed at the outer side of the molding resin, the second portion is seamlessly integrated with the first portion, the first portion of the resin film has an upper surface and the second portion of the resin film has an upper surface, the upper surface of the second portion is lower than the upper surface of the first portion by providing a rising portion between the second portion and the first portion, and the upper surface of the second portion has less uneven portions that are caused by the wiring part compared with the upper surface of the first portion.

2. The mold package according to claim 1, wherein the resin film further includes a protruded portion that is disposed at the outer side of the end of the molding resin and is disposed farther from the end of the molding resin compared with the second portion, and the protruded portion has an upper surface that is protruded relative to the upper surface of the second portion.

3. A manufacturing method of a mold package, wherein the mold package includes:
a substrate having a first surface and a second surface disposed opposite to the first surface;
a wiring part disposed on the first surface of the substrate and protruded from the first surface of the substrate;
a molding resin disposed on the first surface of the substrate, the molding resin partially sealing the first surface of the substrate and partially sealing the wiring part, the molding resin including an end disposed on the wiring part and intersecting with the wiring part, and the end of the molding resin being disposed at a periphery portion of the molding resin so that a portion of the wiring part is exposed from the molding resin and a remaining portion of the wiring part is sealed by the molding resin; and
a resin film disposed between the first surface of the substrate and the end of the molding resin, the resin film sealing the wiring part and a portion of the first surface of the substrate which is adjacent to the wiring part, and the resin film extending from an inner side of the end of the molding resin to an outer side of the end of the molding resin,
the manufacturing method comprising:
a preparation process preparing the substrate on which the wiring part is disposed;
a resin film formation process forming the resin film on a predetermined portion of the first surface of the substrate, wherein the predetermined portion is a portion that faces the resin film to be formed; and
a molding process placing the substrate to which the resin film is attached in a metal mold and forming the molding resin on the first surface of the substrate, wherein the metal mold has a cavity and the cavity has a shape corresponding to a shape of the molding resin, and the end of the molding resin is disposed on the wiring part via the resin film and intersects with the wiring part,
the resin film includes a first portion disposed at the inner side of the molding resin and a second portion disposed at the outer side of the molding resin, the second portion is seamlessly integrated with the first portion, the metal mold is partially contacted with and pressed on the resin film in the molding process to shape the second portion of the resin film, and the second portion of the resin film has an upper surface disposed lower than an upper surface of the first portion by a rising portion, and
the molding resin is filled in the metal mold after the upper surface of the second portion is pressed by the metal mold to have less uneven portions compared with the upper surface of the first portion.

4. The manufacturing method of the mold package according to claim 3, wherein
the second portion is pressed by the metal mold in the molding process to form a protruded portion, and
the protruded is disposed at the outer side of the end of the molding resin farther from the end of the molding resin compared with the second portion and has an upper surface protruded relative to the upper surface of the second portion.

\* \* \* \* \*